United States Patent [19]
Nishii

[11] Patent Number: 5,370,973
[45] Date of Patent: Dec. 6, 1994

[54] METHOD OF FABRICATING A FINE STRUCTURE ELECTRODE

[75] Inventor: Katsunori Nishii, Hirakata, Japan

[73] Assignee: Matsushita Electric Industrial Co., Ltd., Osaka, Japan

[21] Appl. No.: 975,439

[22] Filed: Nov. 12, 1992

[30] Foreign Application Priority Data

Nov. 12, 1991 [JP] Japan .................. 3-294721

[51] Int. Cl.$^5$ .................. G03C 5/00; G03C 5/04
[52] U.S. Cl. .................. 430/315; 430/312; 430/319; 430/329; 430/396
[58] Field of Search ............ 430/312, 315, 319, 329, 430/396

[56] References Cited

U.S. PATENT DOCUMENTS

| | | | |
|---|---|---|---|
| 4,554,564 | 11/1985 | van Gorkom et al. | 346/161 |
| 4,633,090 | 12/1986 | Hahn | 250/492.2 |
| 4,647,339 | 3/1987 | Houghton | 156/643 |
| 4,898,804 | 2/1990 | Rauschenbach et al. | 430/311 |
| 5,045,417 | 9/1991 | Okamoto | 430/22 |
| 5,194,344 | 3/1993 | Cathey, Jr. et al. | 430/22 |
| 5,194,345 | 3/1993 | Rolfson | 430/22 |
| 5,194,346 | 3/1993 | Rolfson et al. | 430/22 |
| 5,208,125 | 5/1993 | Lowrey et al. | 430/22 |
| 5,217,830 | 6/1993 | Lowrey | 430/22 |
| 5,234,780 | 8/1993 | Nitayama et al. | 430/313 |
| 5,248,575 | 9/1993 | Ogoshi | 430/319 |
| 5,302,477 | 4/1994 | Dao et al. | 430/312 |

FOREIGN PATENT DOCUMENTS

| | | | |
|---|---|---|---|
| 0106037 | 7/1982 | Japan | 430/312 |
| 2-159734 | 6/1990 | Japan | . |
| 2-172234 | 7/1990 | Japan | . |
| 0187011 | 7/1990 | Japan | 430/312 |
| 3-147338 | 6/1991 | Japan | . |
| 3-235948 | 10/1991 | Japan | 430/396 |
| 4355449 | 12/1992 | Japan | 430/312 |

Primary Examiner—Bowers, Jr. Charles L.
Assistant Examiner—J. Pasterczyk
Attorney, Agent, or Firm—Ratner & Prestia

[57] ABSTRACT

A fine structure T-shaped electrode is fabricated using a phase shift method. A photoresist layer is formed on a semiconductor substrate and the photoresist layer is exposed to an exposure light having a first wavelength through a photomask which has a desired pattern of a base shifting layer whereby the phase of the exposure light is shifted by 180 degrees. The photoresist layer is then exposed to another exposure light having a second wavelength that is different from the first wavelength through the photomask. The photoresist is developed to form a T-shaped resist cavity and a metal layer is deposited over the resist layer formed on the semiconductor substrate. All the metal layer is removed except for the areas covering the T-shaped photoresist pattern. The T-shaped electrode is also formed by disposing a photoresist layer on a semiconductor substrate. The photoresist is exposed to an exposure light through a photomask which has a desired pattern of a phase shift layer whereby the phase of the exposure light is reversed and the light blocking layer to block the exposure light are formed at a certain fixed distance from and in parallel with the edge of said phase shifting layer pattern and are also formed inside as well as outside of the phase shifting layer pattern. The photoresist is developed to form a T-shaped photoresist cavity. A metal layer is deposited over the photoresist pattern formed on the semiconductor substrate. All of the metal layer is then removed except for the areas covering the T-shaped photoresist pattern.

4 Claims, 8 Drawing Sheets

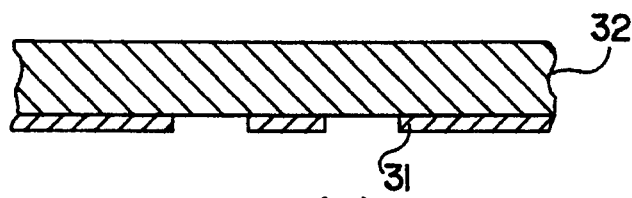
FIG. I(a)
PRIOR ART
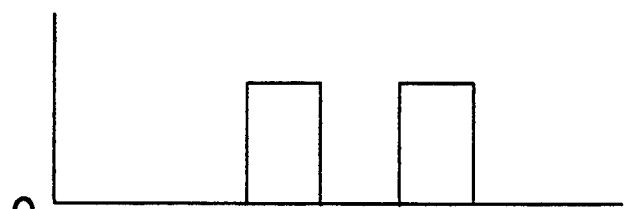
FIG. I(b)
PRIOR ART
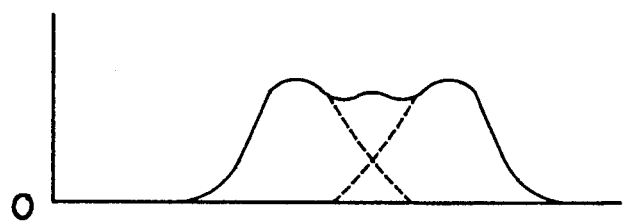
FIG. I(c)
PRIOR ART
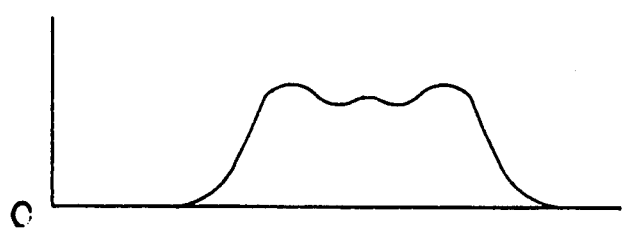
FIG. I(d)
PRIOR ART

METHOD OF FABRICATING A FINE STRUCTURE ELECTRODE

BACKGROUND OF THE INVENTION

This invention relates to a method of fabricating a fine structure electrode and particularly to a method of fabricating a T-shaped fine structure electrode.

As the integration density and the performance enhancement of semiconductive devices is progressing more and more in recent years, the pattern dimensions are becoming finer and finer, entering into a sub-micron range. At present optical lithography is generally employed to form patterns in the process of fabricating semiconductive devices. However, in fabricating a device like HEMT (high electron mobility transistor) that requires a fine structure electrode of about 0.3 $\mu$m as the gate electrode, electron-beam lithography is usually used. The optical lithography has had 0.5 $\mu$m as the pattern limit and for a finer structure electrode fabrication, electron-beam lithography and X-ray lithography have been effectively used.

On the other hand, in recent photolithography technology utilizing a projection exposure, research activity has been carried out aggressively on a fine resist pattern forming technology, namely, a so-called phase shifting method. This phase shifting method aims to form a fine pattern of less than 0.5 $\mu$m by using existing projection exposure equipment with an improvement applied to a photomask. More specifically stating, this method employs a phase shifting layer that can have the phase of a part of the exposure light after passage of the photomask shifted and can improve the resolving power of the projection exposure method. A brief explanation about the principle of this method is made with the help of FIG. 1(a) through (d) and FIG. 2(a) through (d) in the following:

FIG. 1(a) through (d) show a widely known projection exposure method that uses an ordinary photomask 32 consisting only of a light blocking layer 31 and FIG. 2(a) through (d) shows the projection exposure that uses a phase shifting method using a phase shifting layer 33.

When a photomask 32 with non-phase shifting layer 33 is used as in FIG. 1(a), the phase direction of the light passing through the transparent area of the photomask 32 is not changed as in FIG. 1(b).

Therefore, when a resist pattern having dimensions close to the resolution limit to cause a light diffraction as in FIG. 1(c) is to be formed, the amplitudes of the lights passing through the transparent areas adjacent to each other overlap at the surface of a wafer and the light intensity contrast between the transparent area and the light blocking area observed at the surface of the wafer becomes not as pronounced as described in FIG. 1(d).

On the other hand, when a photomask 34 having a phase shifting layer 33 is used as shown in FIG. 2(a), the phase of the light passing through a transparent area incorporated with the phase shifting layer 33 is turned by 180 degrees against the phase of the light passing the area with no phase shifting layer 33 as shown FIG. 2(b). Thus, if one of the two adjacent areas is covered with a phase shifting layer 33, the amplitudes of the light passing through these transparent areas that are situated almost within a distance of the resolving limit from each other become zero at the surface of the wafer near the intermediate point between the two transparent areas due to the offsetting effect as shown in FIG. 2(d).

Consequently, the resolution power of a projection exposure method is enhanced by employing a phase shifting method whereby the contrast in the light intensity between the areas on the wafer corresponding to the transparent area and the light blocking area of the photomask is enhanced as shown in FIG. 2(d). The phase shifting method as explained in the foregoing is particularly effective in a repetitive formation of a pattern like a line and space pattern.

In contrast to this, as a way to apply the phase shifting method to a pattern of non-repetitive type like the gate pattern of HEMT, there is a method to utilize the end areas of a phase shifting layer of transparent type.

FIG. 3(a) through (d) show the case of a projection exposure wherein the end area of a phase shifting layer of transparent type is utilized. When a photomask 36 with a phase shifting layer 35 is used as in FIG. 3(a), the phase of the light passing through the transparent area with a phase shifting layer 35 formed on it is shifted by 180 degrees at the end of the phase shifting layer 35 as shown in FIG. 3(b). At the surface of a wafer, the light amplitudes overlap due to a diffraction and the light amplitudes near the end of the phase shifting layer are offset to zero as shown in FIG. 3(c). Thus, it is possible to form a fine pattern by having the light intensity reduced to zero at the end of the phase shifting layer 35 as shown in FIG. 3(d).

As described in the foregoing, use of a phase shifting method makes it possible to form a sub-half-micron resist pattern by an ordinary projection exposure method that otherwise has been so far considered impossible.

FIG. 4(a) through (e) show, in cross-sectional views, a process chart of the production method that utilizes a phase shifting method in fabricating a HEMT having a conventional fine structure electrode of T-shaped gates. According to FIG. 4, item 41 is a semiconductor substrate, item 42 is an active area, item 43 is a source drain ohmic electrode, item 44 is a negative photoresist, item 45 is a photomask with a transparent type phase shifting layer 46, item 47 is a fine structure cavity, item 48 is a photoresist, item 49 is a T-shaped resist cavity and item 50 is a gate electrode.

As shown in FIG. 4(a), an active area 42 is formed by mesa etching on a semiconductor substrate 41 having a HEMT structure grown by a MBE method and a source drain ohmic electrode 43 is formed on the foregoing active area 42. Next, as shown in FIG. 4(b), a negative photoresist 44 is applied to all of the surface and this negative photoresist 44 is then developed after it is exposed by a projection exposure to light through a photomask 45 having a transparent type phase shifting layer 46 to form a fine structure cavity 47 of 0.3 $\mu$m as shown in FIG. 4(c). Then, as shown in FIG. 4(d), a photoresist 48 is applied to all of the surface and a photoresist cavity of about 0.8 $\mu$m is formed by a projection exposure on the foregoing fine structure cavity 47 with an exact position alignment to complete the T-shaped resist cavity 49. After that, as shown in FIG. 4(e), a gate metal such as Ti/Pt/Au for example is applied to all of the surface by deposition and the T-shaped gate electrode 50 is formed by a lift-off method to complete an HEMT.

In the case of a fine structure gate HEMT, a reduction in the gate length causes an increase in the gate resistance with a resultant adverse effect imposed to the device's performance. Thus, it is desirable to make the gate electrode into a T-shape in order to reduce the gate resistance. However, according to conventional phase shifting technology, it is desirable to employ a two-layer resist method in forming a fine structure T-shaped resist cavity for fabricating a fine structure T-shaped gate electrode with a resultant complicated production process and also a problem of pattern defects due to a misalignment of positions at the time of forming an upper-layer cavity.

SUMMARY OF THE INVENTION

This invention relates to a method of fabricating a fine structure T-shape electrode in a stable manner by forming a fine structure T-shaped resist pattern with an application of a phase shifting method that is made possible through use of a single layer resist technique.

In order to accomplish the foregoing task, this invention relates to a method comprising a step of forming a photoresist layer on a semiconductor substrate, a step of exposing the photoresist layer to an exposure light having a first wavelength through a photomask which has a desired pattern of a phase shifting layer whereby the phase of the exposure light is shifted by 180 degrees and then to another exposure light having a second wavelength that is different from the first wavelength through the photomask, a step of developing the photoresist to form a T-shaped resist cavity, a step of depositing a metal layer over the photoresist layer formed on the semiconductor substrate and a step of removing all of the metal layer except for the areas covering the T-shaped photoresist pattern.

Also, this invention relates to a method comprising a step of forming a photoresist layer on a semiconductor substrate, a step of exposing the photoresist to an exposure light through a photomask which has a desired pattern of a phase shifting layer whereby the phase of the exposure light is reversed and a light blocking layer to block the exposure light being formed at a certain fixed distance from and in parallel with the edge of said phase shifting layer pattern and also being formed inside as well as outside of said phase shifting layer pattern, a step of developing said photoresist to form a T-shaped photoresist cavity, a step of depositing a metal layer over the photoresist pattern formed on the semiconductor substrate and a step of removing all of the metal layer except for the areas covering the T-shaped photoresist pattern.

BRIEF DESCRIPTION OF THE DRAWING

FIGS. 1(a–d), FIGS. 2(a–d) and FIGS. 3(a–d) are drawings which are useful for explaining the principles of the conventional technology involved.

DETAILED DESCRIPTION OF THE INVENTION

First Exemplary Embodiment

Figure 2A:
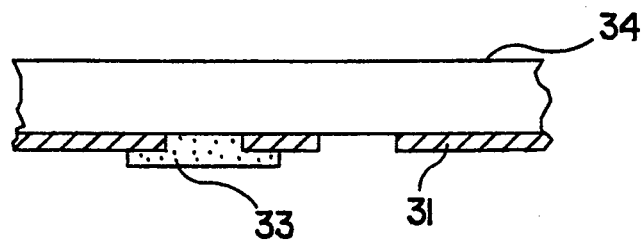
Figure 2B:
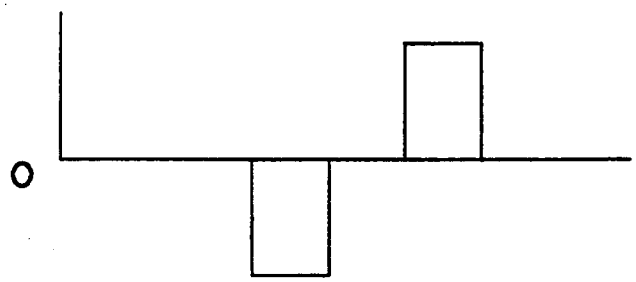
Figure 2C:
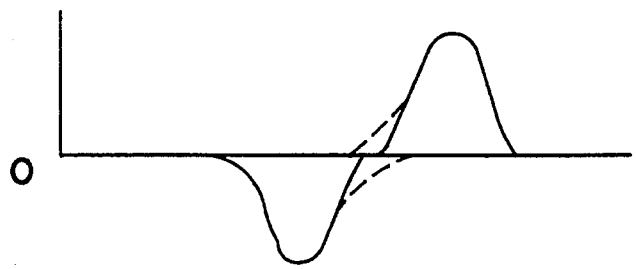
Figure 2D:
Figure 3A:
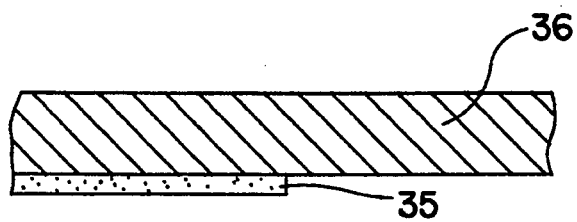
Figure 3B:
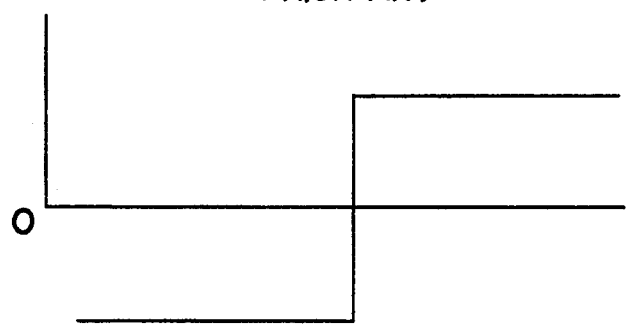
Figure 3C:
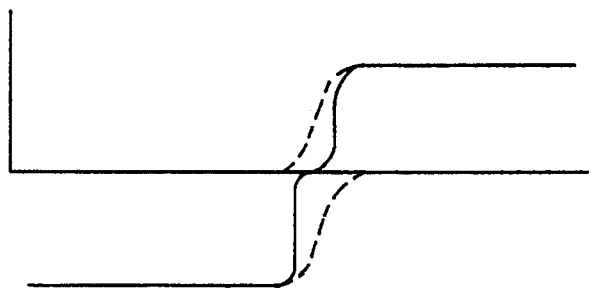
Figure 3D:
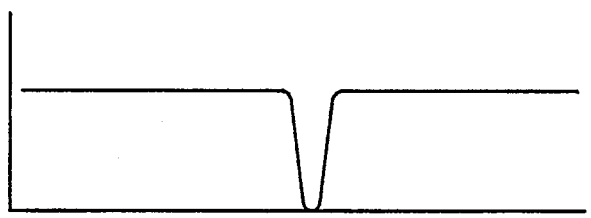
Figure 4A:
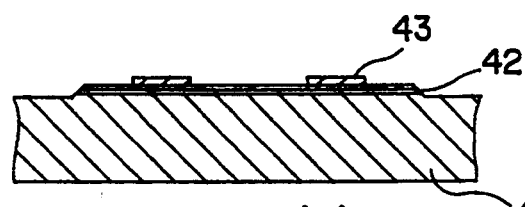
FIGS. 4(a–e) are cross-sectional drawings which illustrate process steps according to the conventional method of fabricating a fine structure electrode.
Figure 4B:
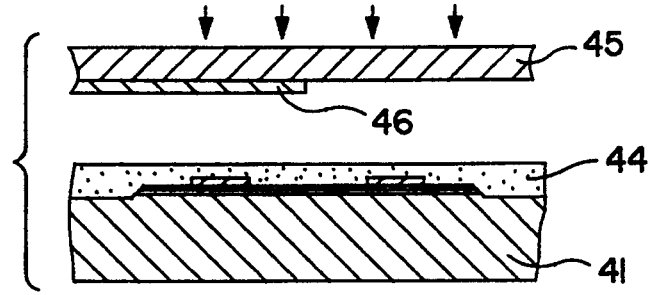
Figure 4C:
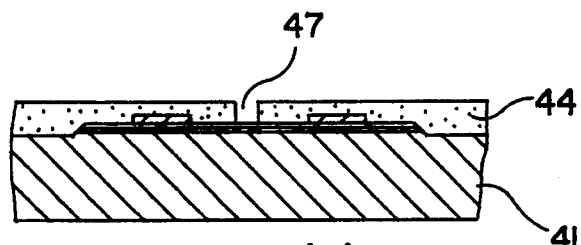
Figure 4D:
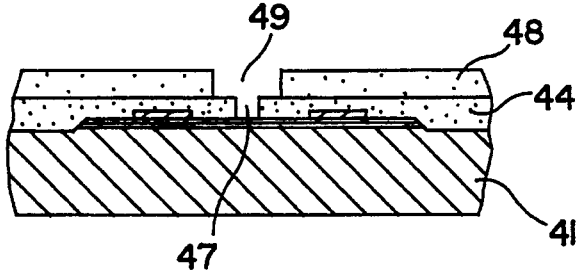
Figure 4E:
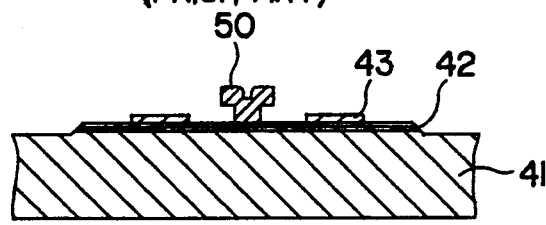
Figure 5A:
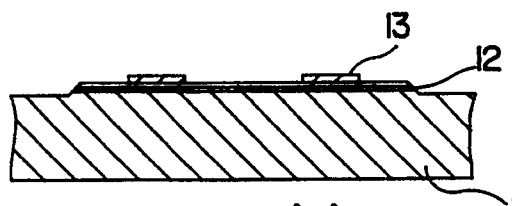
FIGS. 5(a–e) are cross-sectional views which illustrate process steps according to a first exemplary embodiment of the present invention.
Figure 5B:
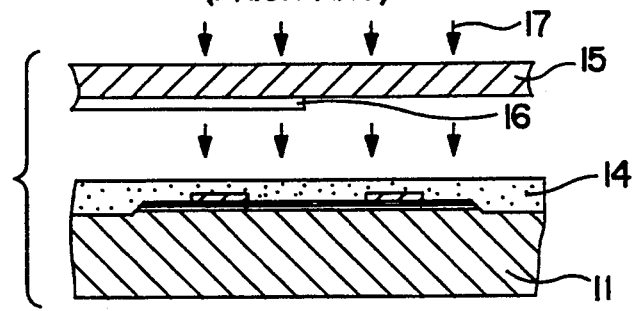

FIG. 5(a) and FIG. 5(b) are cross-sectional drawings which are useful for describing a method of fabricating a T-shaped gate HEMT in accordance with a first exemplary embodiment of the present invention in order to fabricate a fine structure electrode. In FIG. 5a and FIG. 5b, item 11 is a semiconductor substrate, item 12 is an active area, item 13 is a source drain ohmic electrode, item 14 is a negative photoresist, item 15 is a photomask having a transparent phase shifting layer 16, item 17 is a first exposure light, item 18 is a second exposure light, item 19 is a T-shaped resist cavity and item 20 is a gate electrode.

As shown in FIG. 5(a), an active area 12 is formed by a mesa etching method on a semiconductor substrate 11 having a HEMT structure that has been grown by a MBE method and then a source drain ohmic electrode 13 is formed on the foregoing active area 12. Next, as shown in FIG. 5(b), a negative photoresist layer 14 formed over all of the substrate is exposed by a projection exposure method through a photomask 15 incorporated with a phase shifting layer 16 to a first exposure light 17 having a wavelength that causes the phase of the exposure light to shift by 180 degrees after the light passes through the phase shifting layer 16. In an exemplary embodiment of the present invention, the first exposure light 17 is an i-line with a wavelength of 365 nm.

Figure 5C:
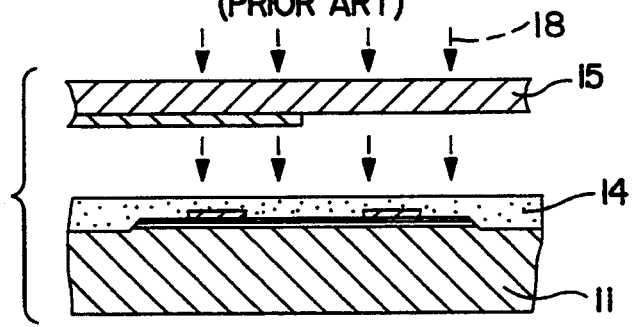
Figure 5D:
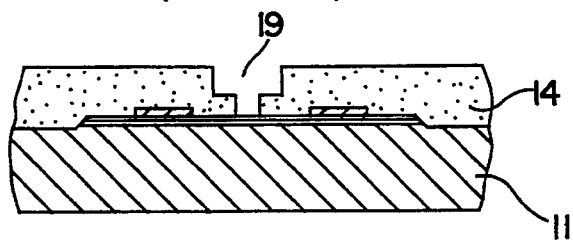
Figure 5E:
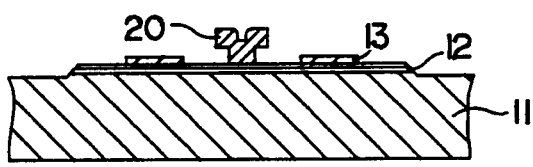

Following the foregoing step as shown in FIG. 5(c), the photoresist layer is exposed to a second exposure light 18 having a wavelength different from that of the first exposure light, the second exposure light 18 being a g-line with a wavelength of 436 nm, for example. Then, the photomask is subjected to a development process and a T-shaped cavity with an opening length of 0.3 μm is formed as shown in FIG. 5(d). After that, as shown in FIG. 5(e), a gate metal such as Ti/Pt/Au, for example, is applied to all of the surface by deposition and a T-shaped gate electrode 20 is formed by a lift-off method to complete a HEMT.

In the first exemplary embodiment of the present invention, a coating type silicone compound is used as the phase shifting layer 16 of the photomask 15 and the thickness t of the layer is made to satisfy the phase reversion condition (1) of the exposure light.

$$t = \lambda/2(n-1) \tag{1}$$

where n is the refractive index of the phase shifting layer, λ is a wavelength of the exposure light and t is the thickness of the phase shifting layer.

When a wavelength λ of the exposure light (the i-line) is 365 nm, and the refractive index n of the phase shifting layer 16 is 1.47, then t=388 nm is obtained. In this example, a layer thickness of 390 nm is used. With this layer thickness, a phase difference of about 2/5 of a wavelength is gained against a g-line having a wavelength of 436 nm.

Figure 6A:
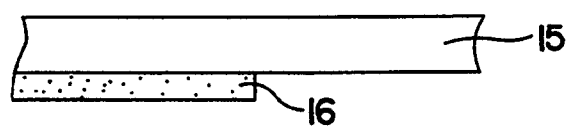
FIGS. 6(a–d) are drawings which are useful for explaining the conditions of light exposure which are involved in the first exemplary embodiment of the present invention as illustrated by FIGS. 5(a–c).
Figure 6B:
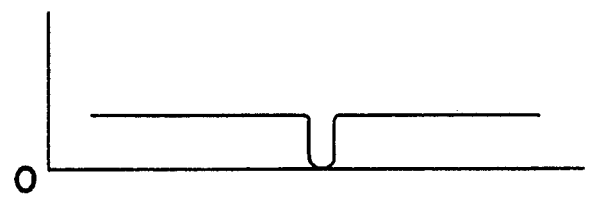

FIGS. 6(a) through (d) illustrate the condition of the projection exposure involved with the first embodiment example of FIG. 5. Using a photomask 15 having a phase shifting layer 16 as shown in FIG. 6(a), the phase of the first exposure light 17 of the i-line is reversed after the light passes through the phase shifting layer 16 since the layer has sufficient thickness to cause a phase reversion and the incident lights overlap at the wafer surface due to a light diffraction, resulting in off-setting the light amplitudes near the end of the phase shifting layer 16 and reducing the light intensity to zero as shown in FIG. 6(b).

Figure 6C:
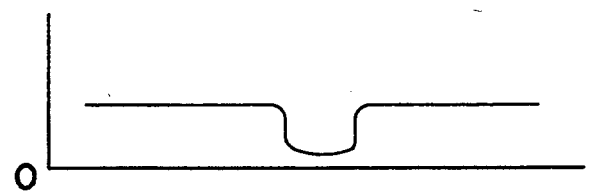
Figure 6D:
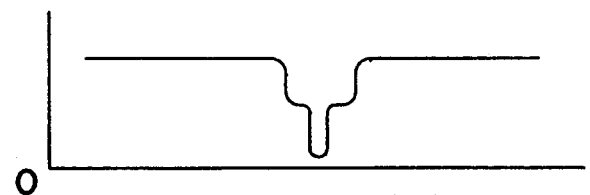

On the other hand, as shown in FIG. 6(c), the amplitudes of the second exposure light of the g-line are not off-set completely near the end of the phase shifting layer 16 since the phase shifting of the light is not a reversion of 180 degrees and the light intensity is not reduced to zero at the wafer surface. In addition, the second exposure light 18 has a longer wavelength compared with that of the first exposure light 17 and the spread of the light near the end of the phase shifting layer 16 is large with a resultant broad width in the area where off-setting of the light amplitudes takes place. Consequently, the width of the area where the light intensity is low becomes broader than the one with the i-line. Therefore, when the photomask is exposed twice, first to the first exposure light 17 and second to the second exposure light 18, the light intensity am the wafer surface becomes T-shaped as shown in FIG. 6(d) and a negative resist layer exposed in this way results in forming a T-shaped cavity 19. By depositing metal over this T-shaped resist cavity for forming a gate electrode, a T-shaped gate electrode 20 having a width of about 0.3 μm at the narrow neck of the T-shape (the bottom opening length) is fabricated.

Although a case wherein the first exposure light 17 has a shorter wavelength than that of the second exposure light 18 is explained in this exemplary embodiment, an equally fine structure gate electrode can be fabricated without any problem when the first exposure light 17 has a longer wavelength than that of the second exposure light 18.

Second Exemplary Embodiment

FIGS. 7(a) through (d) are cross-sectional drawings which are useful for describing a method of fabricating a T-shaped gate HEMT according to a second exemplary embodiment of this invention which relates to a method of fabricating a fine structure electrode. In FIGS. 7(a) through (d), item 21 is a semiconductor substrate, item 22 is an active area, item 23 is a source drain ohmic electrode, item 24 is a negative photoresist, item 25 is a photomask having a transparent phase shifting layer 26 and light blocking layers 27a and 27b, item 28 is an exposure lights item 29 is a T-shaped resist cavity and item 30 is a gate electrode.

Figure 7A:
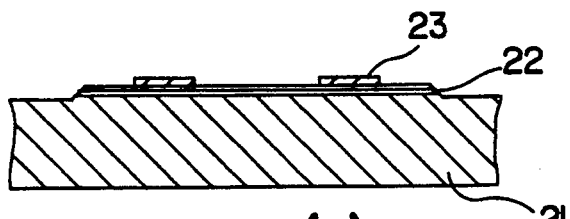
FIGS. 7(a–d) are cross-sectional drawings which illustrate process steps according to a second exemplary embodiment of the present invention.
Figure 7B:
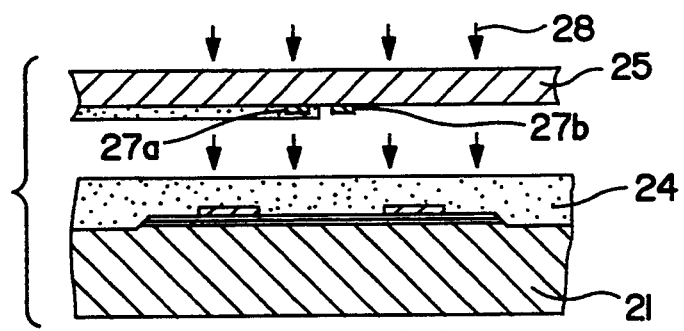
Figure 7C:
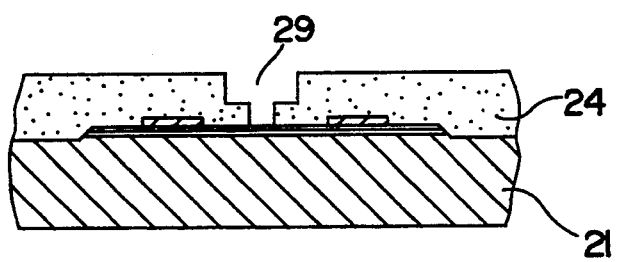
Figure 7D:
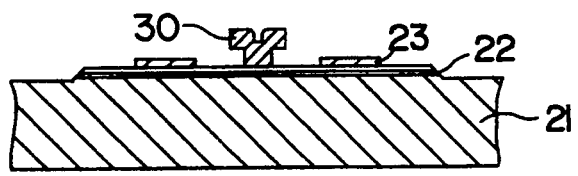

As shown in FIG. 7(a), an active area 22 is formed by a mesa etching method on a semiconductor substrate 21 having a HEMT structure that is grown by a MBE method and then a source drain ohmic electrode 23 is formed on the foregoing active area 22. Next, as shown in FIG. 7(b), a negative photoresist 24 formed over all of the substrate is exposed by a projection exposure method through a photomask 25 having fine light blocking layers 27a and 27b near the end of a transparent phase shifting layer 26 to an exposure light 28 having a wavelength that causes the phase of the exposure light to shift by 180 degrees after its passage through the phase shifting layer 26, the exposure light 28 being an i-line with a wavelength of 365 nm, for example. After that, as shown in FIG. 7(c), the photoresist is developed to form a T-shaped resist cavity 29. Then, as shown in FIG. 7(d), a gate metal such as Ti/Pt/Au, for example, is applied to all of the surface by deposition and a T-shaped gate electrode 30 is formed by a lift-off method which removes the photoresist and metal forming a complete HEMT.

Since a photomask 25 having fine light blocking layers 27a and 27b near the end of a transparent phase shifting layer 26 is employed in the second example of the embodiment of this invention, the condition of the light exposure looks like the drawings of FIG. 8. In this exemplary embodiment as shown in FIG. 8 (a), the light blocking layers 27a and 27b to block an incident exposure light 28 are formed at a certain fixed distance from and in parallel with the end of the transparent phase shifting layer pattern 26 and, in addition, are formed inside as well as outside of the transparent phase shifting layer 26. At this time, the width of the light blocking layers 27a and 27b is made less than the resolution limit.

The reason is this. When the light blocking layers 27a and 27b have dimensions exceeding the resolution limit, an area where no exposure light is extended due to the existence of the light blocking layers 27a and 27b is formed on the surface of the semiconductor substrate 21. In other words, a pattern of the light blocking layers 27a and 27b is formed on the semiconductor substrate 21. Consequently, the dimensions of the pattern are governed by the light blocking layer 27a and 27b making the production of fine structure electrodes impossible.

Therefore, the dimensions of the light blocking layers 27a and 27b have to be less than the resolution limit to produce a fine structure electrode. Here, the resolution limit is defined as the smallest possible width of the pattern formed on the semiconductor substrate 21 by using the light blocking layers 27a and 27b.

Figure 8A:
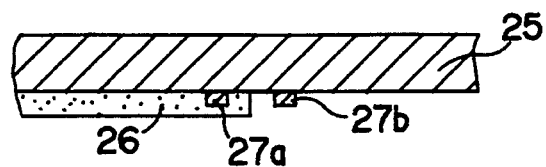
FIGS. 8(a–d) are drawings which are useful for explaining the condition of light exposure involved in the second exemplary embodiment of the present invention as illustrated by FIGS. 7a–d.
Figure 8B:
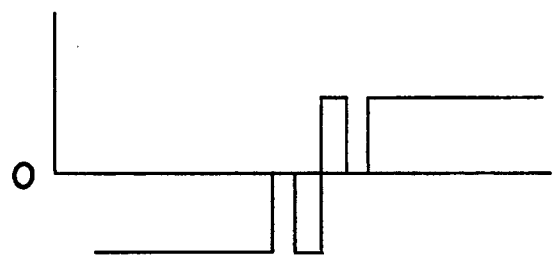

The resolution limit referred to above (also known as resolving power) may also be defined as the minimum dimension which is able to be recognized under the exposure light. The resolution limit changes with the wavelength of the exposure light. In other words, the smaller the wavelength, the smaller the resolution limit. The resolution limit also changes with the distance from the spot where light is irradiated. For example, the position of blocking layers 27a and 27b can be recognized at the photomask as shown in FIG. 8b, while they cannot be recognized at a wafer which is distant from the blocking layers as shown in FIG. 8c.

Figure 8C:
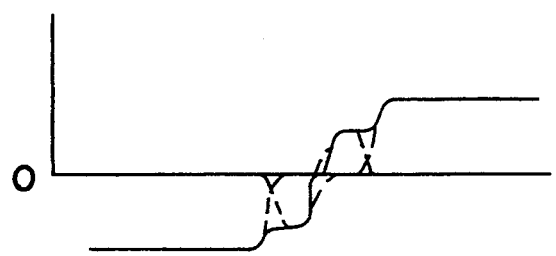
Figure 8D:
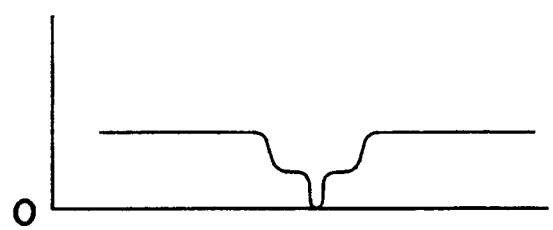

In the arrangement which is shown in FIG. 8c, the light intensity is as shown in FIG. 8d. Because the blocking layers cannot be recognized at the wafer, the wafer is within a resolution limit.

If the width of light blocking layers 27a and 27b is made less than the resolution limit of exposure light 28, the continuous slope X of FIG. 8c appears resulting from the fine pattern of light intensity Y of FIG. 8d on the wafer. That is, the blocking layers are too small to be recognized under the exposure light.

If the width of light blocking layers 27a and 27b exceeds the resolution limit of exposure light, the continuous slope X of FIG. 8c does not appear. Also the fine patter Y of FIG. 8d does not appear. Rather, a split pattern Z appears. This comes from the fact that the blocking layer width is too large not to be recognized under the exposure light, that is, the blocking layer width is larger than the resolution limit.

Because, in an exemplary embodiment of the present invention, the fine pattern Y of FIG. 8d is obtained, the width of light blocking layers 27a and 27b is preferably smaller than the resolution limit of exposure light.

With the use of such a photomask 25, the light amplitude at the photomask looks like FIG. 8(b), the one at the wafer surface looks like FIG. 8(c) since a reversion takes place at the edge of the phase shifting layer 26 and the one at the light blocking layers 27a and 27b becomes continuous due to the light refraction.

Thus, the light amplitude at the wafer surface shows a T-shape as described in FIG. 8(d) and a T-shaped cavity is fabricated with the use of a negative resist by means of this exposure method.

In the second exemplary embodiment of this invention, an i-line stepper having a numerical aperture of 0.40 and a reduction ratio of 1/10 is used as the projection exposure equipment and THMR-iN100 of Tokyo Chemical Application Industry Co., Ltd. is used as the negative resist 24. A coating type silicone compound (refractive index of 1.47) is used for the phase shifting layer 26 and its thickness is made to 390 nm. The light blocking layers 27a and 27b are made of Cr/Au with a width of 2 μm and formed at a position of 2 μm from the edge of the phase shifting layer 26. After patterning under the above condition, a T-shaped cavity 29 having a bottom opening length of 0.3 μm and an upper opening length of 0.8 μm is fabricated. A metal to make the gate electrode is deposited over this cavity and then a T-shaped gate electrode 30 is produced.

In this second exemplary embodiment, a T-shaped resist cavity 29 of 0.3 μm is realized. However, a pattern with an even finer structure can be formed by setting an optimum condition for the exposure and the development and also by using a higher NA for the stepper. The configuration of the T-shaped resist cavity 29 is dependent on the width and the position of the light blocking layers 27a and 27b and by changing the width and the position of the light blocking layers 27a and 27b, the configuration of the T-shaped resist cavity 29 can be controlled.

Although a coating type silicone compound is used as the phase shifting layer in the exemplary embodiments of this invention, such non-organic layers as silicon oxide and silicon nitride or such organic layers as resist and the like can be equally well used.

The i-line of 365 nm in wave length or the g-line of 436 nm in wave length is used as the exposure light in the exemplary embodiments of this invention. However, other kinds of light, such as an excimer laser of 248 nm in wavelength, for example, can also be used.

What is claimed is:

1. A method of fabricating a fine structure electrode comprising the steps of:

forming a negative photoresist layer on a semiconductor substrate;

exposing said negative photoresist layer to a first exposure light having a first wavelength through a photomask, said photomask having a phase shifting layer with a desired pattern which shifts the phase of said exposure light by 180 degrees;

exposing said negative photoresist layer to a second exposure light having a second wavelength, different from the first wavelength, through said photomask;

developing said negative photoresist to form a photoresist pattern, said photoresist pattern having a T-shaped resist cavity;

depositing a metal layer on said photoresist pattern formed on said semiconductor substrate so that said T-shaped cavity is filled with said metal layer; and removing all of said metal layer except for a portion of said metal layer filling said T-shaped resist cavity.

2. A method of fabricating a fine structure electrode according to claim 1, wherein the second wavelength is longer than the first wavelength.

3. A method of fabricating a fine structure electrode, comprising the steps of:

forming a negative photoresist layer on a semiconductor substrate;

exposing said negative photoresist layer to an exposure light through a photomask, said photomask having a phase shifting layer, a first light blocking layer and a second light blocking layer in a pattern, said pattern having a resolution limit defined by a smallest dimension of said pattern, said phase shifting layer shifting the phase of said exposure light 180 degrees, said first light blocking layer and said second light blocking layer blocking said exposure light, each respective one of said first and second light blocking layers having first and second sides and a width extending from said first side to said second side, said width of said blocking layers being less than said resolution limit, said phase shifting layer having an edge defined by a transition from the inside to the outside of said phase shifting layer, said pattern having said first light blocking layer buried in said phase shifting layer and said second light blocking layer external to said phase shifting layer and said pattern also having said first and said second light blocking layers formed at a certain fixed distance from and in parallel with said edge of said phase shifting pattern;

developing said negative photoresist to form a photoresist pattern, said photoresist pattern having a T-shaped cavity;

depositing a metal layer on said negative photoresist pattern formed on said semiconductor substrate so that said T-shaped cavity is filled with said metal layer; and removing all of said metal layer except for a portion of said metal layer filling said T-shaped resist cavity.

4. A method of fabricating a fine structure electrode according to claim 3, wherein each one of said first and said second light blocking layers, for blocking exposure light, is formed at an equal distance from the edge of said phase shifting layer.

* * * * *